United States Patent
Sriram

(10) Patent No.: US 7,402,844 B2
(45) Date of Patent: Jul. 22, 2008

(54) METAL SEMICONDUCTOR FIELD EFFECT TRANSISTORS (MESFETS) HAVING CHANNELS OF VARYING THICKNESSES AND RELATED METHODS

(75) Inventor: Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/289,158

(22) Filed: Nov. 29, 2005

(65) Prior Publication Data

US 2007/0120168 A1 May 31, 2007

(51) Int. Cl.
*H01L 29/778* (2006.01)
(52) U.S. Cl. .................. 257/192; 438/172; 257/E29.14
(58) Field of Classification Search ................ 257/283, 257/284, 183–201; 438/172
See application file for complete search history.

(56) References Cited

U.S. PATENT DOCUMENTS

| | | | |
|---|---|---|---|
| 3,903,592 A | 9/1975 | Heckl |
| 4,732,871 A | 3/1988 | Buchmann et al. |
| 4,737,469 A | 4/1988 | Stevens |
| 4,757,028 A | 7/1988 | Kondoh et al. |
| 4,762,806 A | 8/1988 | Suzuki et al. |
| 4,803,526 A | 2/1989 | Terada et al. |
| 4,897,710 A | 1/1990 | Suzuki et al. |
| 4,947,218 A | 8/1990 | Edmond et al. |
| 5,229,625 A | 7/1993 | Suzuki et al. |
| 5,264,713 A | 11/1993 | Palmour |
| 5,270,554 A | 12/1993 | Palmour |
| 5,289,015 A | 2/1994 | Chirovsky et al. |
| 5,300,795 A | 4/1994 | Saunier et al. |
| 5,306,650 A | 4/1994 | O'Mara, Jr. et al. |
| 5,396,085 A | 3/1995 | Baliga |
| 5,399,883 A | 3/1995 | Baliga |
| 5,510,630 A | 4/1996 | Agarwal et al. |
| 5,686,737 A | 11/1997 | Allen |
| 5,719,409 A | 2/1998 | Singh et al. |
| 5,742,082 A | 4/1998 | Tehrani et al. |
| 5,821,576 A | 10/1998 | Sriram |
| 5,869,856 A | 2/1999 | Kasahara |

(Continued)

FOREIGN PATENT DOCUMENTS

DE 195 28 604 A1 9/1996

(Continued)

OTHER PUBLICATIONS

U.S. Appl. No. 10/977,054, filed Oct. 29, 2004, Sriram et al.

(Continued)

*Primary Examiner*—Bradley W Baumeister
*Assistant Examiner*—Matthew L Reames
(74) *Attorney, Agent, or Firm*—Myers, Bigel, Sibley & Sajovec, P.A.

(57) ABSTRACT

A unit cell of a metal-semiconductor field-effect transistor (MESFET) is provided. The unit cell includes a MESFET having a source, a drain and a gate. The gate is between the source and the drain and on a channel layer of the MESFET. The channel layer has a first thickness on a source side of the channel layer and a second thickness, thicker than the first thickness, on a drain side of the channel layer. Related methods of fabricating MESFETs are also provided herein.

23 Claims, 7 Drawing Sheets

U.S. PATENT DOCUMENTS

| | | | |
|---|---|---|---|
| 5,891,769 | A | 4/1999 | Liaw et al. |
| 5,895,939 | A | 4/1999 | Ueno |
| 5,900,648 | A | 5/1999 | Harris et al. |
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,686,616 | B1 | 2/2004 | Allen et al. |
| 6,906,350 | B2 | 6/2005 | Sriram |
| 6,956,239 | B2 | 10/2005 | Sriram |
| 2003/0017660 | A1 | 1/2003 | Li |
| 2004/0099888 | A1 | 5/2004 | Sriram |

FOREIGN PATENT DOCUMENTS

| | | |
|---|---|---|
| DE | 19900169 A1 | 7/1999 |
| EP | 0 518 683 A1 | 12/1992 |
| EP | 0 523 593 A1 | 1/1993 |
| JP | 47-5124 | 3/1972 |
| JP | 54155482 A | 12/1979 |
| JP | 59134874 A | 8/1984 |
| JP | 60142568 A | 7/1985 |
| JP | 60154674 A | 8/1985 |
| JP | 60189250 A | 9/1985 |
| JP | 63047983 A | 2/1988 |
| JP | 63-263771 A | 10/1988 |
| JP | 64-081274 A | 3/1989 |
| JP | 01059961 A | 3/1989 |
| JP | 1106476 | 4/1989 |
| JP | 1106477 | 4/1989 |
| JP | 1196873 | 8/1989 |
| JP | 1308876 | 12/1989 |
| JP | 02010772 A | 1/1990 |
| JP | 04225534 A | 8/1992 |
| JP | 09036359 A | 2/1997 |
| JP | 11150124 A | 6/1999 |
| WO | WO 98/19342 | 5/1998 |
| WO | WO 98/20563 A1 | 5/1998 |
| WO | WO 01/67521 A1 | 9/2001 |
| WO | WO 01/86727 A2 | 11/2001 |
| WO | WO2005114749 * | 12/2005 |

OTHER PUBLICATIONS

U.S. Appl. No. 10/977,227, filed Oct. 29, 2004, Sriram et al.
U.S. Appl. No. 11/012,553, filed Dec. 15, 2004, Sriram.
U.S. Appl. No. 11/157,356, filed Jun. 21, 2005, Sriram.
*A 10 W 2 GHz Silicon Carbide MESFET,* Microwave Journal, Sep. 1999, pp. 232, 240, 242.
Allen, *Silicon Carbide MESFET's with 2W/mm and 50% P.A.E. at 1.8 GHz,* 1996.
Browne, Editorial: *The Power and the Glory,* Microwaves & RF, Jul. 1999, p. 17.
Browne, *SiC MESFET Delivers 10-W Power at 2GHZ,* Microwaves & RF, Oct. 1999, pp. 138-139.
Browne, *Top Products of 1999,* Microwaves & RF, Dec. 1999, pp. 223-233.
Carter et al., *Silicon Carbide and Related Materials, 1999, Part 2,* Materials Science Forum, vols. 338-342, pp. 1247-1266 (2000).
Evwaraye et al., "Examination of Electrical and Optical Properties of Vanadium in Bulk n-Type Silicon Carbide," *J. Appl. Phys.* vol. 76, No. 10, 1994.
*First Silicon Carbide Microwave Power Products Are Introduced,* Applied Microwave & Wireless, pp. 104.

Heftman, *Wireless Semi Technology Heads Into New Territory,* Microwaves & RF, Feb. 2000, pp. 31-38.
Hilton et al., *Suppression of Instabilities in 4H-SiC Microwave MESFETs,* 2000 8th IEEE International Symposium.
Hilton et al., *Surface Induced Instabilities in 4H-SiC Microwave MESFETs,* Materials Science Forum, vols. 338-342, 2000, pp. 1251-1254.
Jonsson et al., *Physical Simulations on the Operations of 4H-SiC Microwave Power Transistors,* Materials Science Forum, vols. 338-342, 2000, pp. 1263-1266.
Kelner et al., *β-SiC MESFET's and Buried-Gate JFET's,* IEEE Electron Device Letters, vol. EDL-8, No. 9, Sep. 1987, pp. 428-430.
Kong et al., *Temperature Dependence of the Current-Voltage Characteristics of Metal-Semiconductor Field-Effect Transistors in n-Type β -SiC Grown Via Chemical Vapor Deposition,* Appl. Phys Lett., vol. 51, No. 6, Aug. 10, 1987, pp. 442-444.
Konstantinov et al., High Performance Silicon Carbide MESFET Utilizing Lateral Epitaxy, *Materials Science Forum,* vols. 389-393, pp. 1375-1378.
Konstantinov et al., *Investigation of Lo-Hi-Lo and Delta-Doped Silicon Carbide Structures,* Mat. Res. Soc. Symp. Proc., vol. 640, 2001, pp. H2.4.1-H2.4.6.
Long, Wei et al., "Dual-Material Gate (DMG) Field Effect Transistor," *IEEE Trans. Electron Dev.,* vol. 46, No. 5, pp. 865-879 (May 1999).
Ma, et al., *High Efficiency LDMOS Power FET for Low Voltage Wireless Communications,* 1996 IEEE.
Nilsson et al., *Characterization of SiC MESFETs on Conducting Substrates,* Materials Science Forum, vols. 338-342, 2000, pp. 1255-1258.
Noblanc et al., *Power Density Comparison Between Microwave Power MESFET's Processed on Conductive and Semi-Insulating Wafer,* Materials Science Forum, vols. 338-342, 2000, pp. 1247-1250.
Palmour et al., *Characterization of Device Parameters in High-Temperature Metal-Oxide-Semiconductor Field Effect Transistors in β SiC Thin Films,* J. Appl. Phys, vol. 64, No. 4, Aug. 15, 1988, pp. 2168-2177.
Palmour et al., *High-Temperature Depletion-Mode Metal-Oxide-Semiconductor Field Effect Transistors in Beta-SiC Thin Films,* Appl. Phys. Lett., vol. 51, No. 24, Dec. 14, 1987, pp. 2028-2030.
Palmour et al., *Ultrafast Silicon-Carbide Rectifiers,* Powertechnics Magazine, Aug. 1989, pp. 18-21.
Rorsman et al., *Fabrication, Characterization and Modeling of SiC MESFETs,* Materials Science Forum, vols. 338-342, 2000, pp. 12-59-1262.
Rotella, F.M. et al., "Modeling, Analysis, and Design of RF LDMOS Devices Using Harmonic-Balance Device Simulation," *IEEE Trans. Microwave Theor. Tech.,* vol. 48, No. 6, pp. 991-999 (Jun. 2000).
Shur, Michael, "Split-gate Field-Effect Transistor," *Appl. Phys. Lett.,* vol. 54, No. 2, pp. 162-164 (Jan. 9, 1989).
*SiC MESFET Drives PCS Base Stations,* Wireless Systems Design, Oct. 1999, pp. 24.
Soares, ed., *GaAs MESFET Circuit Design,* Artech House, 1988, pp. 7-9, 17-18.
Sze, *Physics of Semiconductor Devices, Second Edition,* John Wiley & Sons, 1981, pp. 341-347.
Xiong, Zhibin et al., "P-6: A Novel Self-Aligned Lightly-Doped-Drain Polysilicon Thin-Film Transistor Using a Partial Exposure Technique," SID 04 Digest, pp. 240-243.
Yokogawa et al., *Electronic Properties of Nitrogen Delta-Doped Silicon Carbide Layers,* Mat. Res. Soc. Symp. Proc., vol. 640, 2001, pp. H2.5.1-H2.5.6.
International Search Report and Written Opinion of the International Searching Authority, corresponding to PCT/uS2006/004139, mailed Mar. 26, 2007.

* cited by examiner

METAL SEMICONDUCTOR FIELD EFFECT TRANSISTORS (MESFETS) HAVING CHANNELS OF VARYING THICKNESSES AND RELATED METHODS

FIELD OF THE INVENTION

The present invention relates to microelectronic devices and, more particularly, to transistors, for example, metal-semiconductor field-effect transistors (MESFETs).

BACKGROUND OF THE INVENTION

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads.

Metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

As discussed in *Split-gate Field-Effect Transistor* by Shur (Appl. Phys. Lett., vol. 54, pages 162-164, January 1989) and *Dual-Material Gate (DMG) Field Effect Transistor* by Long et al. (IEEE Trans. Electron Dev., vol. 46, pp. 865-870, May 1999), performance of field effect transistor (FET) structures may be improved by providing for a lateral variation of the threshold and/or pinch-off voltage along the channel of the device. For example, in a silicon Laterally-diffused metal oxide semiconductor (Si LDMOS) structure the threshold voltage along the channel may be varied using a laterally diffused p-type layer as discussed in *Modeling Analysis and Design of RF LDMOS Devices Using Harmonic-Balance Device Simulation* by Rotella et al. (IEEE Tran.Electron Dev., vol 48, pp. 991-999, June 2000). As discussed therein, devices having more positive threshold voltages on the source side of the gate exhibit a higher electron velocity over a large part under the gate, higher drain current and higher, more uniform transconductance.

SUMMARY OF THE INVENTION

Some embodiments of the present invention provide a unit cell of a metal-semiconductor field-effect transistor (MESFET). The unit cell includes a MESFET having a source, a drain and a gate. The gate is between the source and the drain and on a channel layer of the MESFET. The channel layer has a first thickness on a source side of the channel layer and a second thickness, thicker than the first thickness, on a drain side of the channel layer.

In further embodiments of the present invention, the first thickness may be from about 300 Å to about 800 Å and the second thickness T2 may be from about 500 Å to about 1500 Å. The gate has a first sidewall and a second sidewall, the first sidewall being on a source side of the gate and the second sidewall being on a drain side of the gate. The channel layer having the first thickness may extend from about 0.15 to about 0.3 µm from the first sidewall of the gate towards the drain. The channel layer having the second thickness may extend from about 0.2 to about 0.5 µm from the second sidewall of the gate towards the source.

In still further embodiments of the present invention, a silicon carbide (SiC) substrate may be provided and the channel layer may be provided on the SiC substrate. The channel layer may be n-type conductivity SiC. The channel layer may have a thickness of from about 500 Å to about 3000 Å and a carrier concentration of from about $1.0 \times 10^{16}$ cm$^{-3}$ to about $2.0 \times 10^{18}$ cm$^{-3}$.

In some embodiments of the present invention, first and second ohmic contacts may be provided on the channel layer that respectively define the source and the drain. A recess may be provided between the source and the drain that exposes the channel layer. The recess may have a first depth on a source side of the recess that defines the first thickness of the channel layer and a second depth on a drain side of the recess that defines the second thickness of the channel. The gate may be disposed in the recess. The first depth may be from about 700 Å to about 2200 Å and the second depth may be from about 500 Å to about 1500 Å

In further embodiments of the present invention, an insulator layer may be provided on the channel layer. The recess may extend through the insulator layer into the channel layer. The insulator layer may include nitride and/or oxide. In certain embodiments of the present invention, the MESFET may exhibit lateral variation of a pinch-off voltage along the channel layer.

While the present invention is described above primarily with reference to MESFETs, methods of fabricating MESFETs are also provided.

DETAILED DESCRIPTION OF EMBODIMENTS OF THE INVENTION

Figure 1:
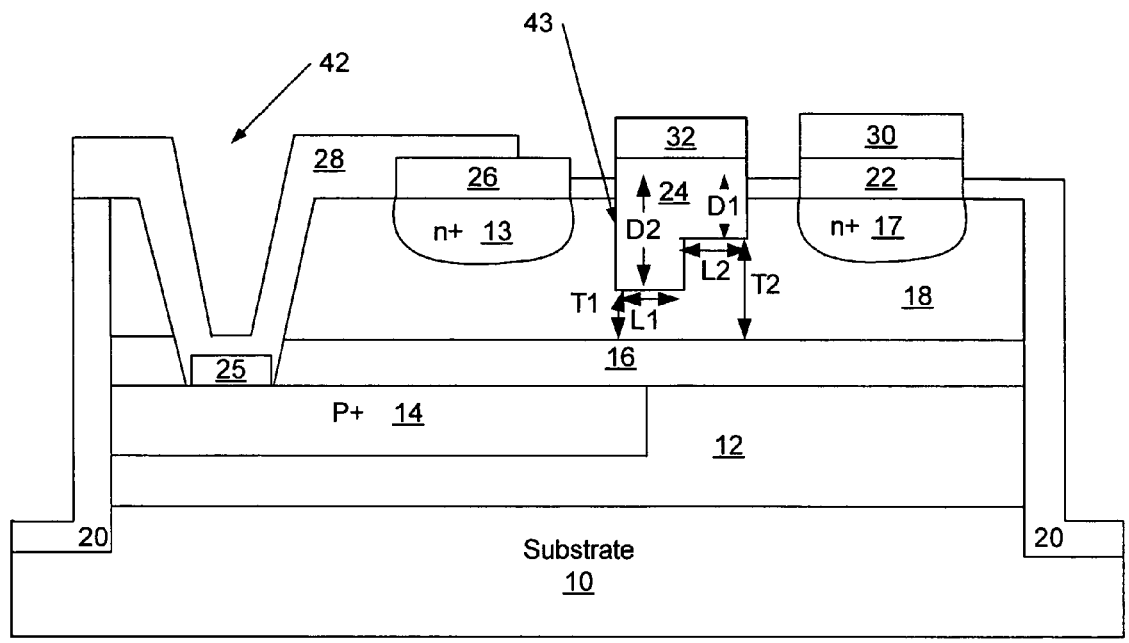
FIG. 1 is a cross section illustrating transistors according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 3D that illustrate various embodiments of the present invention and various processes of fabricating embodiments of the present invention. Metal semiconductor field effect transistors (MESFETs), according to some embodiments of the present invention, provide a lateral variation in pinch-off voltage in the channel layer. Thus, MESFETS according to some embodiments of the present invention may have relatively higher electron velocities, higher drain currents and higher, more uniform transconductances. SiC MESFETs (or MESFETS fabricated with low-mobility materials) according to some embodiments of the present invention may exhibit more significant device performance improvements. Accordingly, the high frequency gain of devices according to some embodiments of the present invention may be improved. Furthermore, a more uniform transconductance is typically important to the reduction of distortion and improvement of the linearity and efficiency of the device.

As will be discussed further below, MESFETs according to some embodiments of the present invention include a channel region having varying thicknesses. For example, the channel region may be thinner on the source side of the device and thicker on the drain side of the device. The thinner channel typically has a lower pinch-off voltage than the thicker channel. Furthermore, MESFETS according to some embodiments of the present invention may include a gate recess, which may provide a higher power output of the device. The edge of the gate recess may be coincident with the deeper etched part of the channel (thinner portion on the source side), which may be fabricated using methods described herein.

Referring first to FIG. 1, transistors, for example, metal-semiconductor field effect transistors (MESFETs), according to embodiments of the present invention will now be discussed. As illustrated in FIG. 1, a substrate 10 is provided. The substrate 10 may be a single crystal bulk silicon carbide (SiC) substrate of either p-type or n-type conductivity or semi-insulating. The substrate 10 of either p-type or n-type may be very lightly doped. The substrate may be formed of silicon carbide selected from the group of 6H, 4H, 15R or 3C silicon carbide. Although the present invention is described herein with reference to a SiC substrate, the present invention should not be limited to SiC. For example, in some embodiments, the substrate 10 may also include, for example, gallium arsenide (GaAs) and/or Gallium Nitride (GaN).

An optional buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $0.5 \times 10^{15}$ $cm^{-3}$ to about $3.0 \times 10^{15}$ $cm^{-3}$. Suitable dopants include aluminum, boron and/or gallium. The buffer layer 12 may have a thickness of about 2.0 µm. Although the buffer layer 12 is described above as p-type silicon carbide, the invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 is preferably less than about $5.0 \times 10^{14}$ cm$^{-3}$.

As further illustrated in FIG. 1, a p$_+$ region 14 is provided beneath a source of the device that has an end that extends towards the drain of the device. As used herein, "p$^+$" or "n$^+$" refer to regions that are defined by higher carrier concentrations than are present in adjacent or other regions of the same or another layer or substrate. MESFETs having a p$^+$ region 14 as illustrated in FIG. 1 are discussed in commonly assigned U.S. patent application Ser. No. 10/304,272, entitled Transistors Having Buried P-Type Layers Beneath The Source Region, filed Nov. 26, 2002, the disclosure of which is hereby incorporated herein by reference as if set forth in its entirety.

Although MESFETs according to embodiments of the present invention discussed herein include a p$^+$ region 14, MESFETs according to embodiments of the present invention are not limited to this configuration. For example, devices such as those described in U.S. Pat. Nos. 4,762,806; 4,757,028; 5,270,554; 5,925,895, 6,686,616 and 6,906,350, the disclosures of which are incorporated herein as if set forth fully, may be utilized in embodiments of the present invention. Also devices such as those described in commonly assigned U.S. patent application Ser. No. 10/977,054, filed on Oct. 29, 2004 entitled Metal-Semiconductor Field Effect Transistors (MESFETs) Having Drains Coupled to the Substrate and Methods of Fabricating the Same; Ser. No. 10/977,227, filed on Oct. 29, 2004 entitled Asymetric Layout Structures for Transistors and Methods of Fabricating the Same; Ser. No. 11/012,553, filed on Dec. 15, 2004 entitled Transistors Having Buried N-Type and P-Type Regions Beneath the Source Regions and Methods of Fabricating the Same; and Ser. No. 11/157,356, filed on Jun. 21, 2005 entitled Semiconductor Devices Having Varying Electrode Widths to Provide Non-Uniform Gate Pitches and Related Methods, the disclosures of which are incorporated herein as if set forth fully, may be used in combination with embodiments of the present invention.

Referring again to FIG. 1. the p$^+$ region 14 is a region of p-type conductivity, for example, p-type conductivity silicon carbide. For the p$^+$ region 14, carrier concentrations of from about $1.0 \times 10^{18}$ cm$^{-3}$ to about $1.0 \times 10^{20}$ cm$^{-3}$ may be suitable, but carrier concentrations as high as possible are preferred. The carrier concentration may not be constant throughout the p$^+$ region 14, but it is preferable that the carrier concentration be as high as possible at the surface of the p$^+$ region 14 to facilitate the formation of ohmic contacts thereon. In some embodiments of the present invention, the p$^+$ conductivity region 14 may be provided in the substrate 10. The p$^+$ conductivity region 14 may, for example, extend about 0.4 μm into the buffer layer 12 or the substrate 10. The presence of the p$^+$ conductivity region 14 beneath the source region may inhibit electron injection from the source, thus, possibly providing an improved breakdown voltage. Furthermore, the fact that the p$^+$ conductivity region 14 does not extend to beneath the drain region may hinder the introduction of parasitics into the device and, thus, device performance may not be influenced.

The buffer layer 12 may be disposed between the substrate 10 and a second buffer layer 16. The second buffer layer 16 may be, for example, p-type silicon carbide having a carrier concentration of from about $1 \times 10^{16}$ cm$^{-3}$ to about $5 \times 10^{16}$ cm$^{-3}$, but typically about $1.5 \times 10^{16}$ cm$^{-3}$. The p-type silicon carbide buffer layer 16 may also have a thickness of from about 0.5 μm to about 1.0 μm. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to buffer layer 12. In some embodiments of the present invention, the second buffer layer 16 may be provided directly on the substrate 10.

A channel layer 18 is provided on the second buffer layer 16, as illustrated in FIG. 1. The channel layer 18 may be, for example, an n-type conductivity channel layer. The n-type conductivity channel layer 18 may be formed of n-type conductivity silicon carbide of 6H, 4H, 15R or 3C polytype. The n-type conductivity channel layer may include one or more layers of, for example, n-type conductivity silicon carbide having different carrier concentrations. The channel layer 18 may have a thickness of from about 500 Å to about 3000 Å and a carrier concentration of from about $1.0 \times 10^{16}$ cm$^{-3}$ to about $2.0 \times 10^{18}$ cm$^{-3}$.

As further illustrated in FIG. 1, n$^+$ regions 13 and 17 are provided in the source and drain regions of the device, respectively. Regions 13 and 17 are typically of n-type conductivity silicon carbide and have carrier concentrations that are greater than the carrier concentration of the n-type conductivity channel layer 18. For the n$^+$ regions 13 and 17, carrier concentrations of about $1 \times 10^{19}$ cm$^{-3}$ may be suitable, but carrier concentrations as high as possible are preferred.

Ohmic contacts 26 and 22 are provided on the implanted regions 13 and 17, respectively, and are spaced apart so as to provide the source contact 26 and the drain contact 22. Ohmic contact 25 is provided on the p$^+$ conductivity region 14 to provide a p$^+$ contact 25. The ohmic contacts 25, 26 and 22 are preferably formed of nickel or other suitable metals. The p$^+$ conductivity region 14 is maintained at the same potential as the source by, for example, electrically coupling the p$^+$ ohmic contact 25 to the source contact 26. An insulator layer 20, such as an oxide, may be further provided on the exposed surface of the device.

Transistors according to certain embodiments of the present invention include a gate recess 43 and a contact via hole 42. The gate recess 43 has first and second depths D1 and D2. The first depth is from about 500 Å to about 1500 Å and the second depth is from about 700 Å to about 2200 Å. As illustrated in FIG. 1, the first recess 43 extends through the insulator layer 20 into the channel layer 18. The contact via hole 42 is provided adjacent the source region 13 and exposes at least a portion of the p$^+$ region 14.

As further illustrated in FIG. 1, due to the first and second depths D1 and D2 of the gate recess 43, the channel layer 18 has multiple thicknesses. A first thickness T1 is provided on the source side of the channel layer and a second thickness T2, thicker than the first thickness T1, is provided on a drain side of the channel layer. In some embodiments of the present invention, the first thickness T1 is from about 300 Å to about 800 Å and the second thickness T2 is from about 500 Å to about 1500 Å.

The gate recess 43 has a first sidewall 43A and a second sidewall 43B. The first sidewall 43A is on a source side of the recess 43 and the second sidewall 43B is on a drain side of the recess 43. The portion of the channel layer having the first thickness T1 has a length L1 that may be from about 0.15 to about 0.3 μm and the portion of the channel layer having the second thickness has a length L2 from about 0.2 to about 0.5 μm. Thus, the portion of the channel layer having the first thickness T1 may extend from about 0.15 to about 0.3 μm from the first sidewall of the gate towards the drain. Similarly, the portion of the channel layer having the second thickness T2 may extends from about 0.2 to about 0.5 μm from the second sidewall of the gate towards the source.

According to some embodiments of the present invention, the lengths L1 and L2 may be designed so that the carriers are in velocity saturation in most of the region and that the breakdown voltage for a given application can be achieved. Device simulation can be done to optimize the lengths L1 and L2 for a specific application.

Accordingly, MESFETs according to some embodiments of the present invention, provide a lateral variation in pinch-off voltage in the channel layer. Thus, these MESFETS may have relatively higher electron velocities, higher drain currents and higher, more uniform transconductances. A more uniform transconductance is typically important to the reduction of distortion and improvement of the linearity and efficiency of the device. Furthermore, MESFETS according to some embodiments of the present invention may include a gate recess, which may provide a higher power output of the device.

Referring again to FIG. 1, the gate contact 24 may be provided in the first recess 43 between the source region 13 and the drain region 17. The gate contact may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the n-type conductivity channel layer 18. The gate contact 24 may further include an overlayer of platinum (Pt) and gold 32 or other highly conductive metal. Alternatively, the gate contact 24 may include a first layer of nickel in the first recess 43 on the n-type conductivity channel layer 18. The gate contact 24 may further include an overlayer on the first layer of nickel that includes a layer of gold.

As further illustrated in FIG. 1, metal overlayers 28, 30 and 32 may be provided on the source and $p^+$ contacts 26 and 25, the drain contact 22 and the gate contact 24, respectively. The overlayers 28, 30 and 32 may be gold, silver, aluminum, platinum and/or copper. Other suitable highly conductive metals may also be used for the overlayer. Furthermore, the metal overlayer 28 may electrically couple the $p^+$ contact 25 of the $p^+$ region 14 to the source contact 26.

Figure 2A:
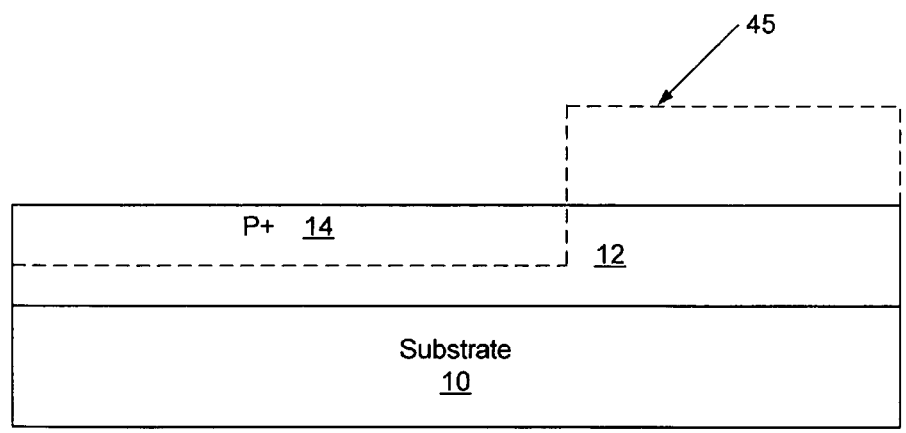
FIGS. 2A through 2E and 2H through 2K are cross sections illustrating processing steps in the fabrication of transistors according to some embodiments of the present invention.

FIGS. 2A through 2K illustrate processing steps in the fabrication of FETs according to some embodiments of the present invention. As seen in FIG. 2A, an optional buffer layer 12 may be grown or deposited on a substrate 10. The substrate 10 may be a semi-insulating SiC substrate, a p-type substrate or an n-type substrate. The substrate 10 may be very lightly doped. The buffer layer 12 may be of p-type conductivity silicon carbide having a carrier concentration of about $3.0 \times 10^{15}$ cm$^{-3}$ or less, but typically $1.0 \times 10^{15}$ cm$^{-3}$ or less. Alternatively, the buffer layer 12 may be n-type silicon carbide or undoped silicon carbide.

Figure 2B:
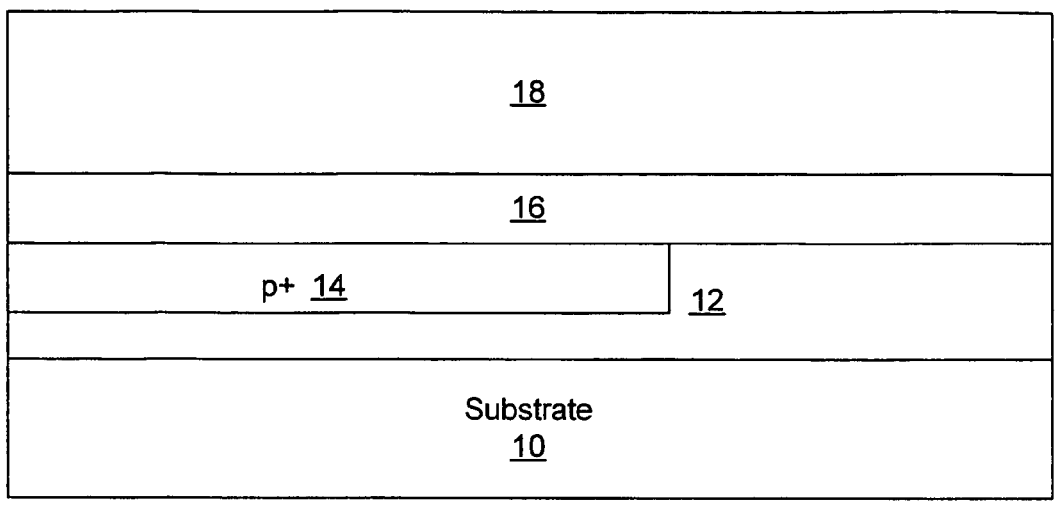

As further illustrated in FIG. 2A, a mask 45 may be formed for implanting the $p^+$ region 14. The $p^+$ region 14 is typically formed by ion implantation of, for example, aluminum, boron and/or gallium, followed by a high temperature anneal. Suitable anneal temperatures may be from about 1300 to about 1600° C., typically about 1500° C. The ion implantation may be performed on the regions that are not covered by the mask 45 to form $p^+$ region 14 as illustrated in FIG. 2B. Thus, the ions are implanted in portions of the buffer layer 12, if present, or the substrate 10, to provide a highly doped region of p-type conductivity, for example, p-type conductivity silicon carbide. Once implanted, the dopants are annealed to activate the implant. The highly doped region of p-type conductivity may extend about 0.4 μm into the buffer layer 12 or the substrate 10.

As seen in FIG. 2B, a second buffer layer 16 and an n-type conductivity channel layer 18 are grown or deposited on the buffer layer 12. It will be understood that if the buffer layer 12 is not included, the second buffer layer 16 and the n-type conductivity channel layer 18 may be grown or deposited on the substrate 10. The second buffer layer 16 is formed on the buffer layer 12 and the n-type conductivity channel layer 18 is formed on the second buffer layer 16 as illustrated in FIG. 2B.

Figure 2C:
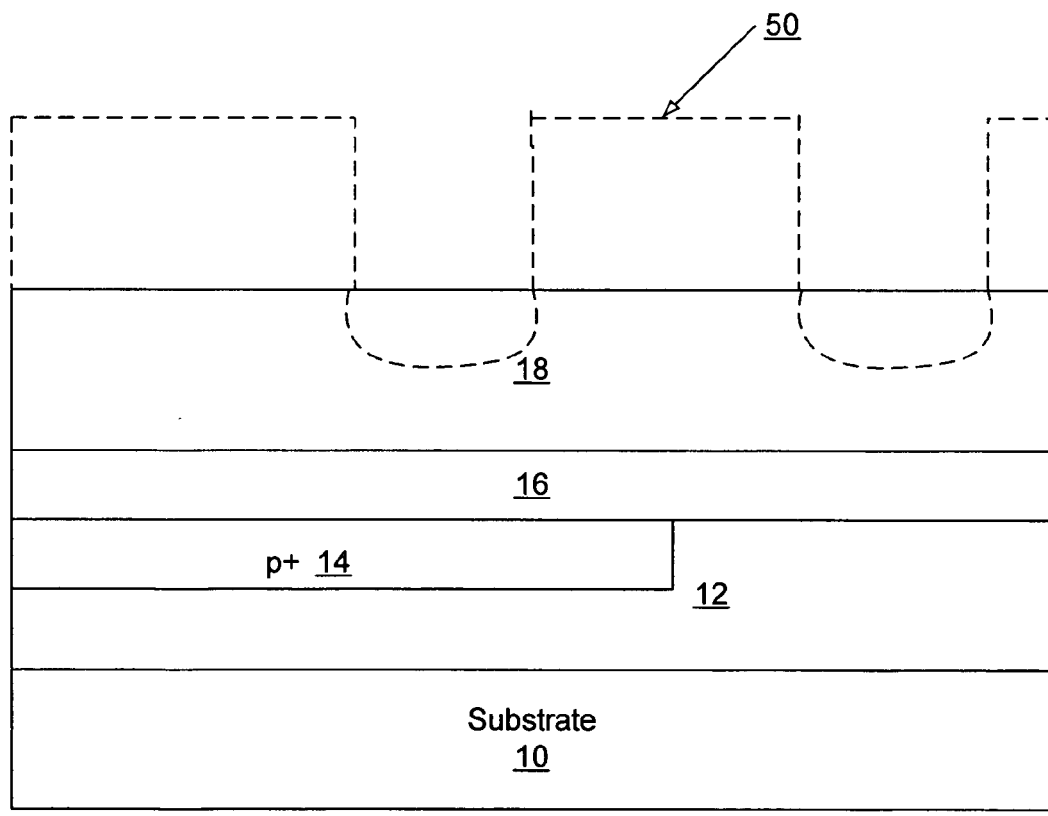
Figure 2D:
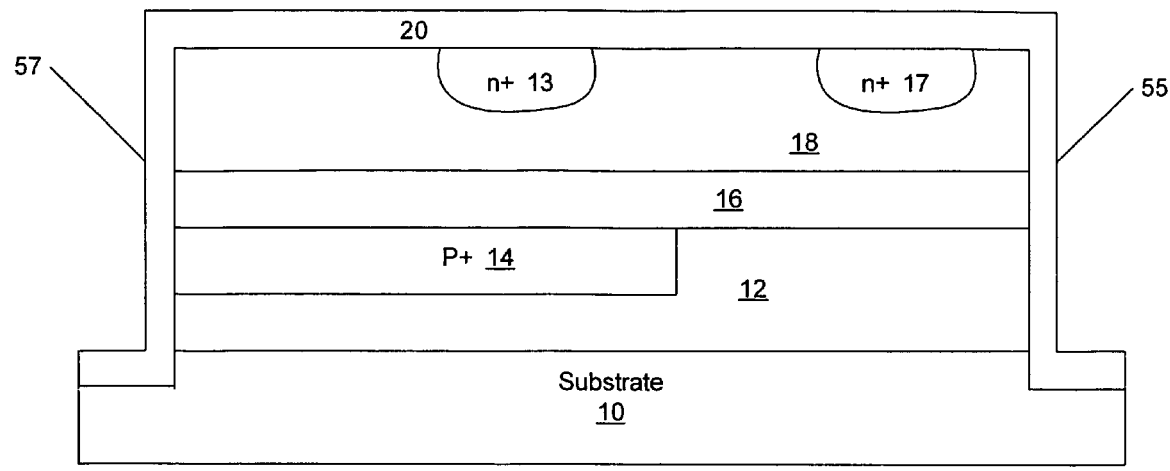

As illustrated in FIG. 2C, a mask 50 may be formed for implanting $n^+$ regions 13 and 17. Regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form $n^+$ regions 13 and 17 as illustrated in FIG. 2D. Thus, the ions are implanted in portions of the n-type conductivity channel layer 18 to provide highly doped regions of n-type conductivity, for example, n-type conductivity SiC, having higher carrier concentrations than the n-type conductivity channel layer 18. Once implanted, the dopants are annealed to activate the implant.

As seen in FIG. 2D, the substrate 10, the buffer layer 12, the $p^+$ region 14, the second buffer layer 16 and the n-type conductivity channel layer 18 may be etched to form an isolation mesa. The mesa has sidewalls 55, 57 defined by the substrate 10, the buffer layer 12, the $p^+$ region 14, the second buffer layer 16 and the n-type conductivity channel layer 18 that define the periphery of the transistor. The sidewalls of the mesa extend downward past the $p^+$ conductivity region 14. The mesa may be formed to extend into the substrate 10 of the device as shown in FIG. 2D. The mesa may extend past the depletion region of the device to confine current flow in the device to the mesa and reduce the capacitance of the device. The mesa is preferably formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

In certain embodiments, only the second buffer layer 16 and the n-type conductivity channel layer 18 may be etched to form an isolation mesa. In these embodiments, the sidewalls 55, 57 are defined by the second buffer layer 16 and the n-type conductivity channel layer 18, which define the periphery of the transistor.

Figure 2E:
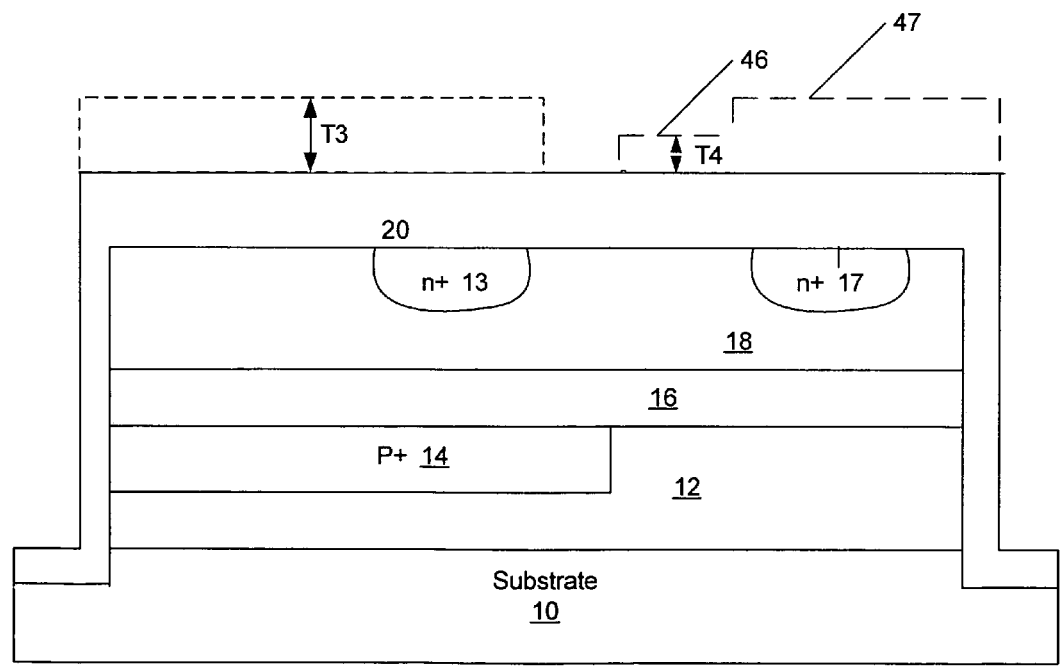

FIG. 2D further illustrates the formation of an insulator layer 20, for example, a nitride and/or oxide layer on the channel layer 18 and the regions 13 and 17. The insulator layer 20 may be grown or deposited. As illustrated in FIG. 2E, a photoresist is formed on the insulator layer 20. The photoresist has first 47 and second 46 portions. The first portion 47 is provided on the $n^+$ regions 13 and 17 and the second portion is provided on a drain side of a gate region. As illustrated, the first portion 47 has a thickness T3 and the second portion 46 has a thickness T4, which is thinner than the thickness T3 of the first portion. The thickness T3 of the first portion may be about 1.0 μm and the thickness of the second portion T4 is less than the thickness T3.

Figure 2H:
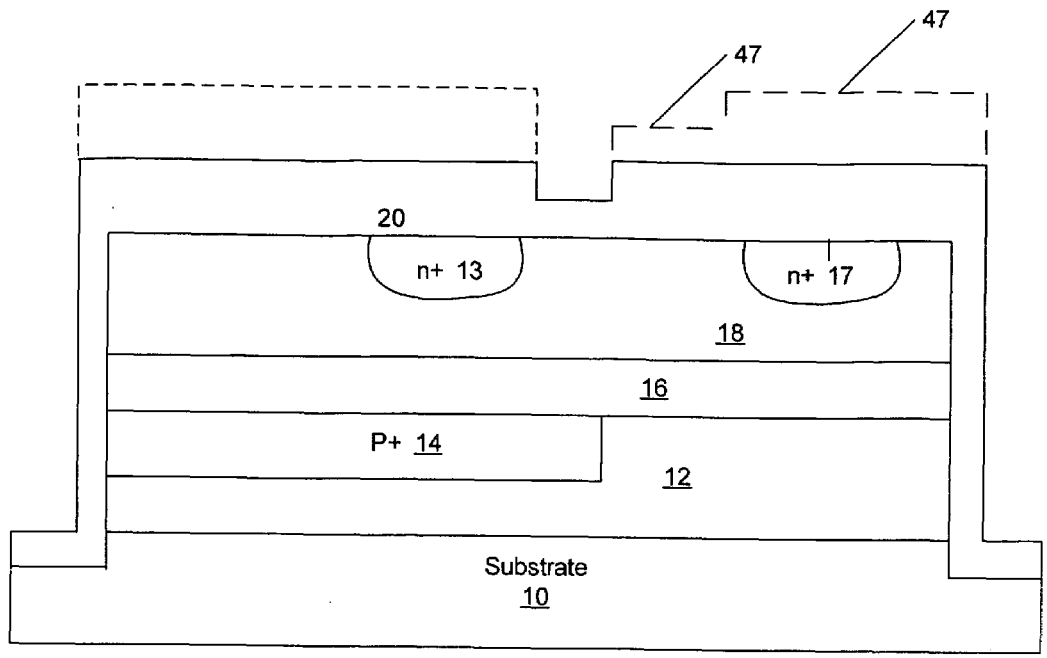

A portion of the insulator layer 20 is etched using, for example, a dry etching process, such as Inductively Coupled Plasma (ICP) etching or reactive ion etching (RIE), as illustrated in FIG. 2H. Thus, erosion of the photoresist may be reduced. The depth of the etch may be determined by the step height and/or by the etch rated of the insulator 20 and the channel layer 18 in a subsequent etching process.

Figure 2I:
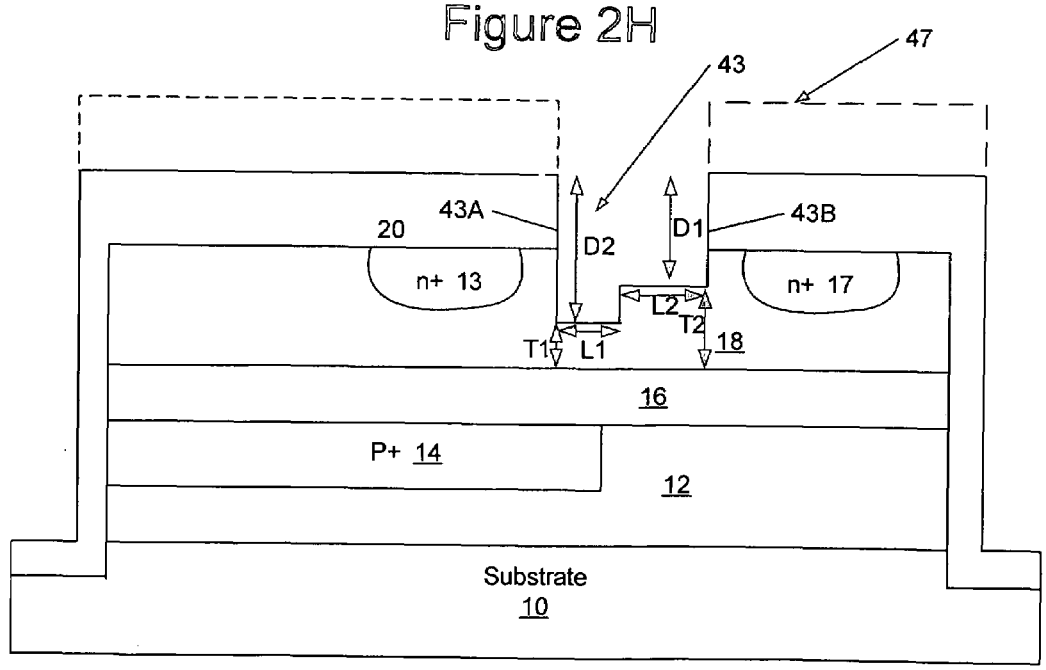

The second portion 46 of the photoresist may be removed. It will be understood that during the removal of the second portion of the photoresist, a portion of the first portion 47 of the photoresist may also be removed. Once the second portion 46 of the photoresist is removed, the insulator 20 and the SiC channel layer 18 may be further etched as illustrated in FIG. 2I to provide a gate recess 43. According to some embodiments of the present invention, the gate recess 43 has first and second depths D1 and D2. The first depth is from about 500 Å to about 1500 Å and the second depth is from about 700 Å to about 2200 Å. As illustrated in FIG. 2I, the first recess extends through the insulator layer 20 into the channel layer 18.

As further illustrated in FIG. 2I, due to the first and second depths D1 and D2 of the gate recess 43, the channel layer 18 has multiple thicknesses. A first thickness T1 is provided on a source side of the channel layer and a second thickness T2, thicker than the first thickness T1, is provided on a drain side of the channel layer. In some embodiments of the present invention, the first thickness T1 is from about 300 Å to about 800 Å and the second thickness T2 is from about 500 Å to about 1500 Å.

Figure 2J:
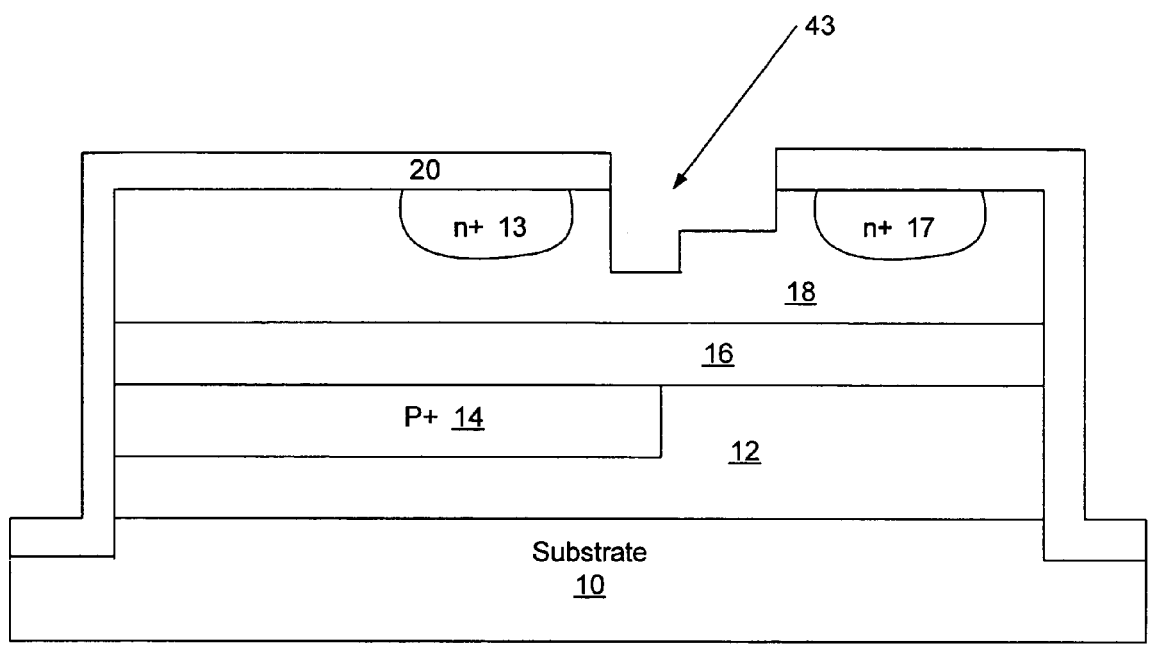

The gate recess 43 has a first sidewall 43A and a second sidewall 43B. The first sidewall 43A is on a source side of the recess 43 and the second sidewall 43B is on a drain side of the recess 43. The portion of the channel layer having the first thickness T1 has a length L1, which is from about 0.15 to about 0.3 μm from the first sidewall of the gate towards the drain. The portion of the channel layer having the second thickness has a length L2, which extends from about 0.2 to about 0.5 μm from the second sidewall of the gate towards the source. The first portion of the photoresist 47 may be removed as illustrated in FIG. 2J.

Figure 3A:
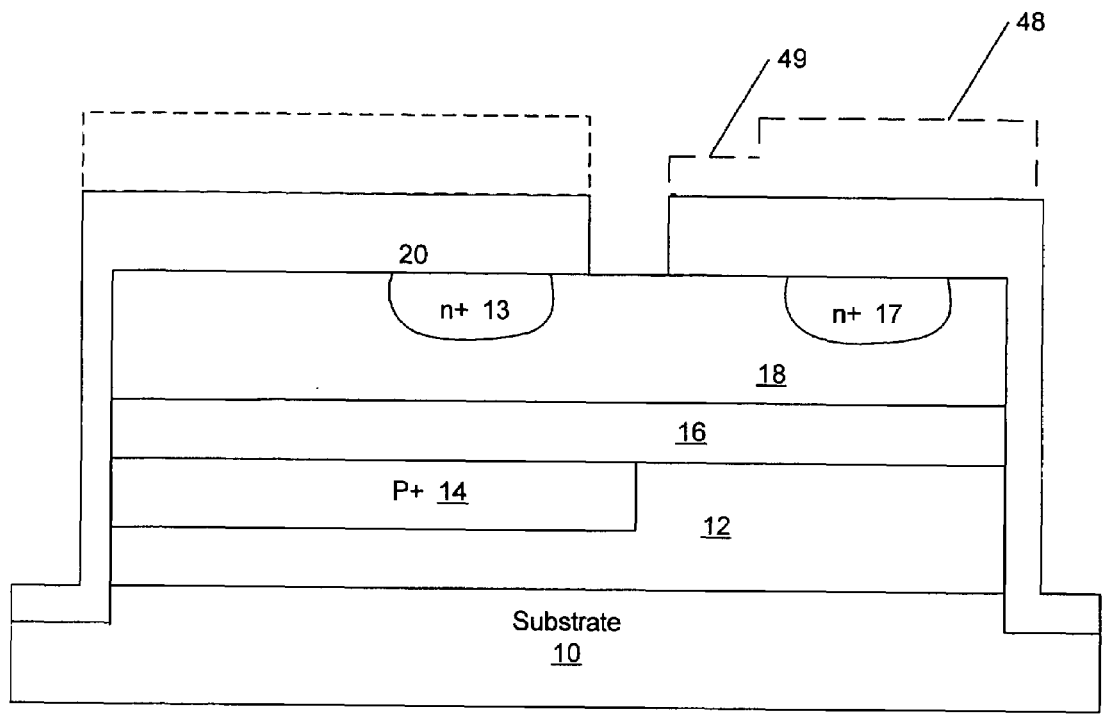
FIGS. 3A through 3D are cross sections illustrating processing steps in the fabrication of transistors according to further embodiments of the present invention.

In some embodiments of the present invention, the recess 43 may be fabricated using processing steps illustrated in FIGS. 3A through 3D. The process discuss with respect to FIG. 3A is discussed in detail in *P-6: A Novel Self-Aligned Lightly-Doped-Drain Polysilicon Thin-Film Transistor Using a Partial Exposure Technique* to Zhibin Xiong et al. (SID 04 DIGETS, pages 240-243), the disclosure of which is hereby incorporated herein by reference as if set forth in its entirety.

As illustrated in FIG. 3A, a photoresist having first 48 and second 49 portion is provided on the insulator layer 20. The first portion 48 is thicker than the second portion 49 as discussed above. The insulator layer 20 is etched through without extending into the channel layer 18. A portion of the insulator layer 20 may remain on the channel layer. The insulator may be etched using, for example, a selective etchant so that the insulator layer 20 is etched without etching the channel layer 18.

Figure 3B:
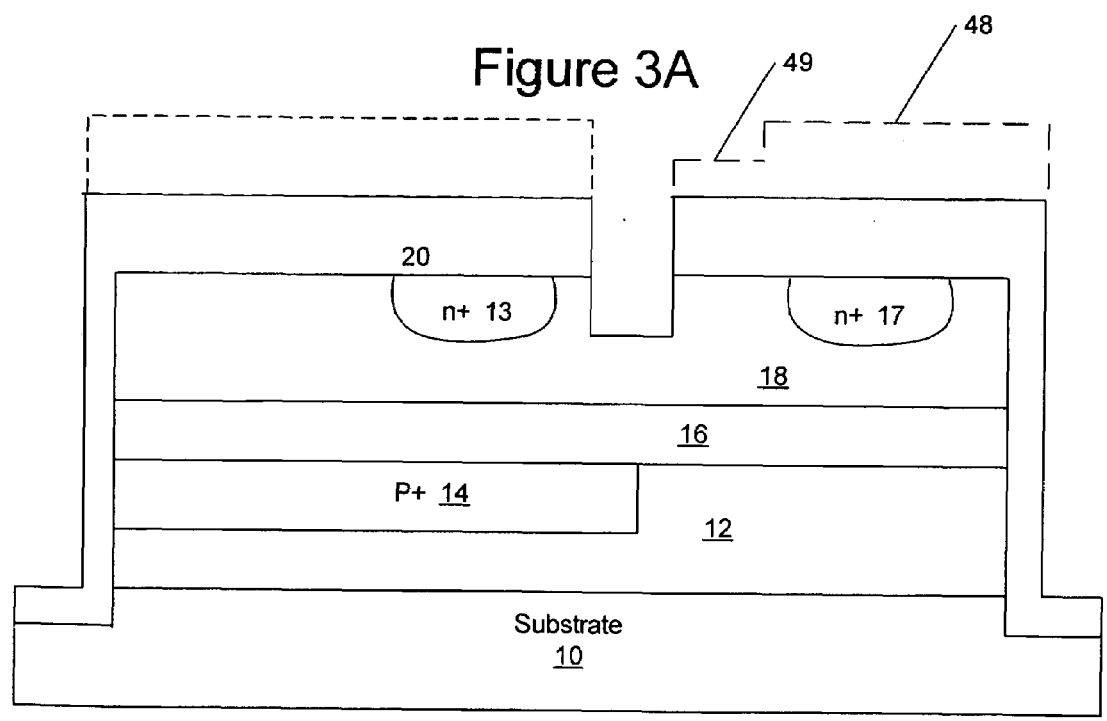
Figure 3C:
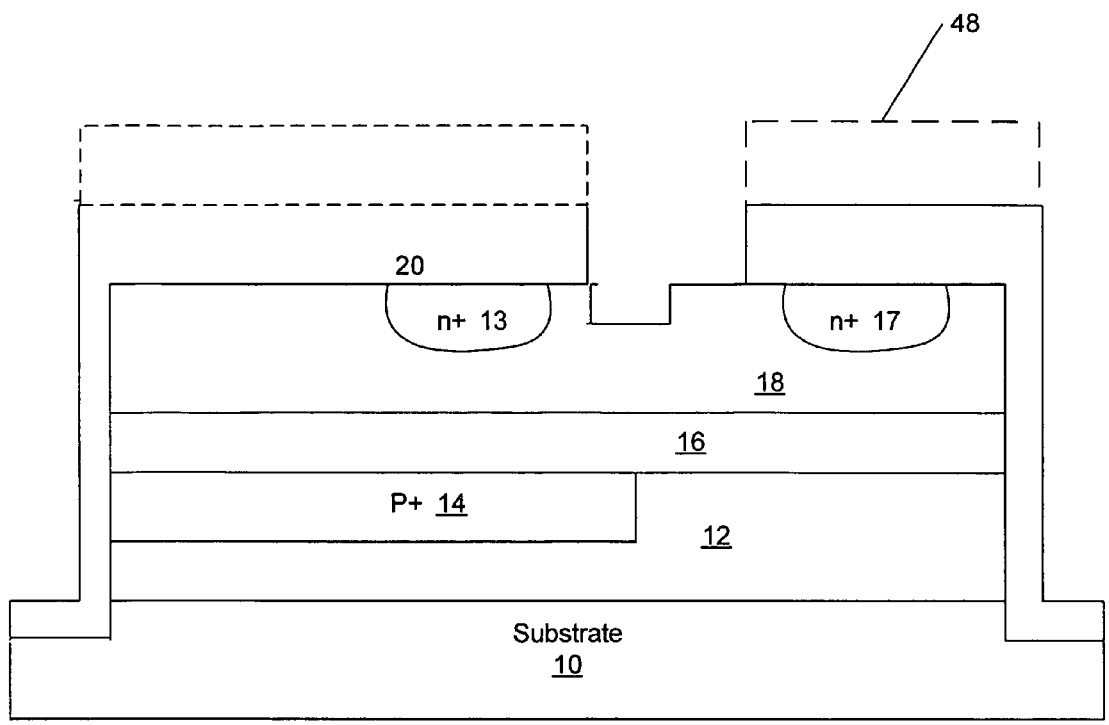
Figure 3D:
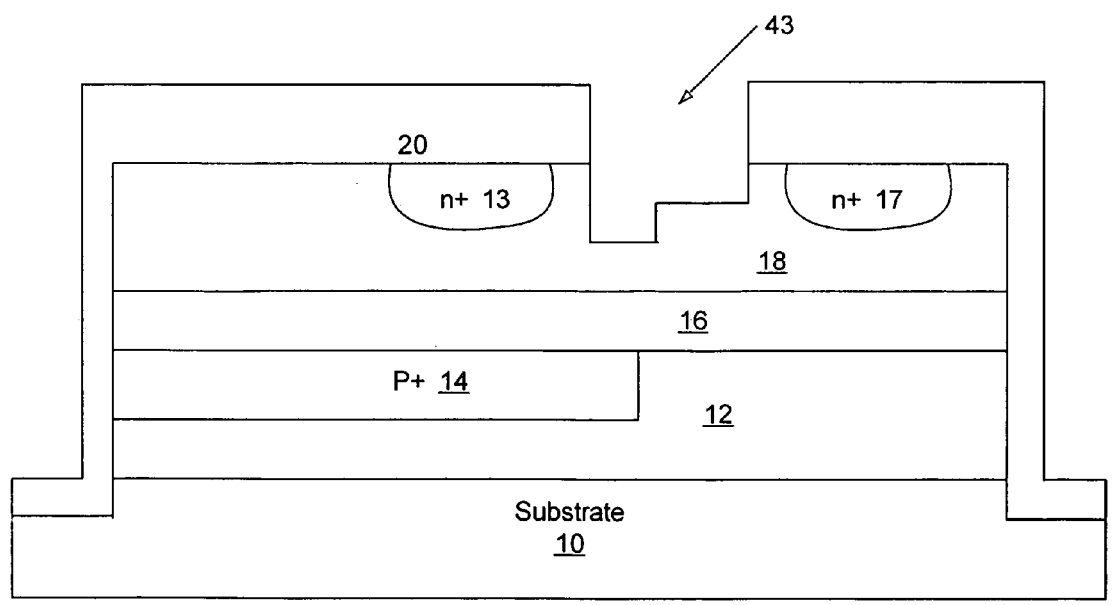

A portion of the channel layer 18 is etched using the second portion of the photoresist 49 and the insulator layer 20 as a mask as illustrated in FIG. 3B. The second portion of the photoresist 49 may be removed as shown in FIG. 3C and the insulator layer 20 that was covered by the second portion of the photoresist 49 may be dry etched using, for example, Inductively Coupled Plasma (ICP) etching or reactive ion etching (RIE). Similarly, the channel layer 18 may be etched using a dry etch as illustrated in FIG. 3C. Both the previously etched portion of the channel layer 18 and the portion of the channel layer 18 that was covered by the second portion 49 of the photoresist may be etched, thus, resulting in a channel layer having varying depths as discussed above and illustrated in FIG. 3D. The first portion 48 of the photoresist may be removed as illustrated in FIG. 3D.

Figure 2K:
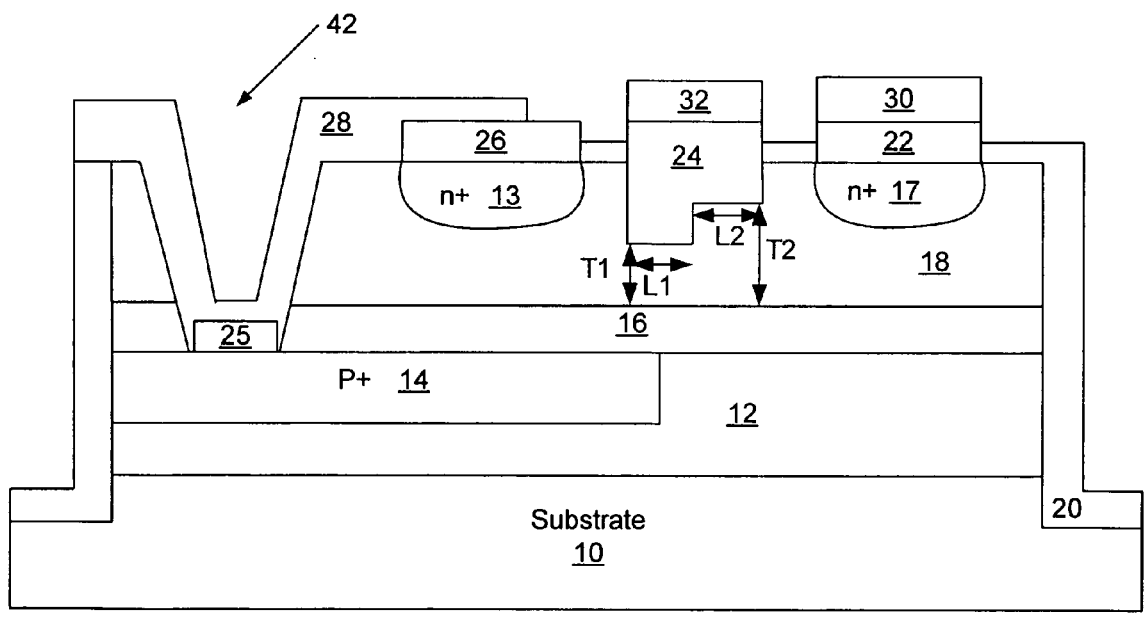

Referring back to FIG. 2K, the MESFET may be completed as illustrated therein. In particular, a mask (not shown) may be formed on the insulator layer 20 and the gate contact 24 may be deposited in the recess 43 according to the mask. Although not illustrated, contact windows may be etched through the insulator layer 20 to the n$^+$ regions 13 and 17. A third contact window may be etched in the insulator layer 20 above the highly doped p$^+$ region 14. Nickel may then be evaporated to deposit the source and drain contacts 26 and 22, respectively. The nickel may be annealed to form the ohmic contacts 26 and 22 as illustrated in FIG. 2K. Such a deposition and annealing process may be carried out utilizing conventional techniques known to those of skill in the art. For example, the ohmic contacts 26 and 22 may be annealed at a temperature of from about 950° C. to about 1100° C. for about 2 minutes. However, other times and temperatures may also be utilized. Times from about 30 seconds to about 10 minutes may be, for example, acceptable.

As further illustrated in FIG. 2K, a contact via hole 42 of the MESFET may be formed. The n-type conductivity channel layer 18 and the second buffer layer 16 may be etched through to expose the p$^+$ conductivity region 14 to form the contact via hole 42. The etching process may be, for example, a dry or wet etch process. As further illustrated in FIG. 2K, nickel may be evaporated to deposit the p$^+$ contact 25. The nickel may be annealed to form the ohmic contact 25. Such a deposition and annealing process may be carried out utilizing conventional techniques known to those of skill in the art. For example, the ohmic contact 25 may be annealed at a temperature of from about 600° C. to about 1050° C.

FIG. 2K also illustrates the overlayers 28, 30 and 32. Typically, the chromium layer (gate contact) is formed by evaporative deposition. The gate structure may then be completed by deposition of platinum and gold. As will also be appreciated by those of skill in the art, the overlayers 28 and 30 may be formed either before or after formation of the gate structure. In fact, if the titanium/platinum/gold structure is utilized, the platinum and gold portions of the overlayer may be formed in the same processing steps as the platinum and gold portions 32 of the gate structure. Accordingly, the overlayers 28 and 30 may be formed prior to the formation of a gate contact or after the formation of a gate contact. As further illustrated, the source contact 26 and the p$^+$ contact share a single overlayer 28, which electrically couples the source to the highly doped p-type conductivity region 14. Alternatively, as discussed above the first recess 43 may be a double recess structure and the gate may be disposed within the double recessed structure.

Although the present invention is described above with reference to SiC MESFETs, the present invention is not limited to SiC MESFETs. For example, MESFETs according to embodiments of the present invention may be, for example, gallium arsenide (GaAs) MESFETs or Gallium Nitride (GaN) MESFETs. In particular, if the present invention were described with respect to GaAs MESFETs, the p-type conductivity regions might be p-type conductivity GaAs regions, the n-type conductivity channel layers might be n-type conductivity GaAs layers and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising:
   a MESFET having a source, a drain and a gate, the gate being between the source and the drain and on a channel layer of the MESFET, the channel layer having a first thickness on a source side of the channel layer and a second thickness, thicker than the first thickness, on a drain side of the channel layer; and
   a recess between the source and the drain that exposes the channel layer, the recess having a first depth on a source side of the recess that defines the first thickness of the channel layer and a second depth on a drain side of the recess that defines the second thickness of the channel, the gate being disposed in the recess, wherein the first depth is from about 700 Å to about 2200 Å and the second depth is from about 500 Å to about 1500 Å.

2. The MESFET of claim 1, wherein the first thickness is from about 300 Å to about 800 Å and wherein the second thickness T2 is from about 500 Å to about 1500 Å.

3. The MESFET of claim 1, wherein the gate has a first sidewall and a second sidewall, the first sidewall being on a source side of the gate and the second sidewall being on a drain side of the gate and wherein the channel layer having the first thickness extends from about 0.15 to about 0.3 µm from the first sidewall of the gate towards the drain.

4. The MESFET of claim 1, wherein the gate has a first sidewall and a second sidewall, the first sidewall being on a source side of the gate and the second sidewall being on a drain side of the gate and wherein the channel layer having the second thickness extends from about 0.2 to about 0.5 µm from the second sidewall of the gate towards the source.

5. The MESFET of claim 1, further comprising a silicon carbide (SiC) substrate, wherein the channel layer is on the SiC substrate and comprises n-type conductivity SiC.

6. The MESFET of claim 5, wherein the channel layer has a thickness of from about 500 Å to about 3000 Å.

7. The MESFET of claim 5, wherein the channel layer has a earner concentration of from about $1.0 \times 10^{16}$ cm$^{-3}$ to about $2.0 \times 10^{18}$ cm$^{-3}$.

8. The MESFET of claim 1, further comprising first and second ohmic contacts on the channel layer that respectively define the source and the drain.

9. The MESFET of claim 1, wherein the MESFET exhibits lateral variation of a pinch-off voltage along the channel layer.

10. A unit cell of a silicon carbide (SiC) metal-semiconductor field-effect transistor (MESFET), comprising:
    a SiC MESFET having a source, a drain and a gate, the gate being between the source and the drain and on a SiC channel layer of the MESFET, the SiC channel layer having a first thickness on a source side of the SiC channel layer and a second thickness, thicker than the first thickness, on a drain side of the SiC channel layer; and
    a recess between the source and the drain that exposes the SiC channel layer, the recess having a first depth on a source side of the recess that defines the first thickness of the SiC channel layer and a second depth on a drain side of the recess that defines the second thickness of the SiC channel, the gate being disposed in the recess, wherein the first depth is from about 700 Å to about 2200 Å and the second depth is from about 500 Å to about 1500 Å.

11. The SiC MESFET of claim 10, the first thickness is from about 300 Å to about 800 Å and wherein the second thickness T2 is from about 500 Å to about 1500 Å.

12. The SiC MESFET of claim 10, wherein the gate has a first sidewall and a second sidewall, the first sidewall being on a source side of the gate and the second sidewall being on a drain side of the gate and wherein the SiC channel layer having the first thickness extends from about 0.15 to about 0.3 µm from the first sidewall of the gate towards the drain.

13. The SiC MESFET of claim 10, wherein the gate has a first sidewall and a second sidewall, the first sidewall being on a source side of the gate and the second sidewall being on a drain side of the gate and wherein the SiC channel layer having the second thickness extends from about 0.2 to about 0.5 µm from the second sidewall of the gate towards the source.

14. The SiC MESFET of claim 10, wherein the SiC MESFET exhibits lateral variation of a pinch-off voltage along the SiC channel layer.

15. A method of forming a unit cell of a metal-semiconductor field-effect transistor (MESFET), comprising:
    forming a MESFET having a source, a drain and a gate, the gate being between the source and the drain and on a channel layer of the MESFET, the channel layer having a first thickness on a source side of the channel layer and a second thickness, thicker than the first thickness, on a drain side of the channel layer,
    wherein the channel layer defines a recess between the source and the drain that exposes the channel layer, the recess having a first depth on a source side of the recess that defines the first thickness of the channel layer and a second depth on a drain side of the recess that defines the second thickness of the channel, the gate being disposed in the recess; and
    wherein the first depth is from about 700 Å to about 2200 Å and the second depth is from about 500 Å to about 1500 Å.

16. The method of claim 15, wherein forming the recess comprises:
    forming a photoresist on the channel layer, the photoresist having first and second portions, the first portion being on the source and the drain and having a third thickness and the second portion being on a drain side of a gate region and having a fourth thickness, thinner than the third thickness;
    etching the recess according to the first and second portions of the photoresist;
    removing the second portion of the photoresist; and
    etching the recess according to the first portion of the photoresist.

17. The method of claim 16:
    wherein forming the recess is preceded by forming an insulator layer on the channel layer;
    wherein etching the recess according to the first and second portions of the photoresist comprises etching into the insulator layer on the source side according to the first and second portions of the photoresist; and
    wherein etching the recess according to the first portion of the photoresist comprises etching through the insulator layer into the channel layer on the source side and the drain side according to the first portion of the photoresist.

18. The method of claim 17, wherein etching the recess according to the first and second portions of the photoresist comprises dry etching using inductively coupled plasma (ICP) and/or reactive ion etching (RIE).

19. The method of claim 17, further comprising:
    forming a gate mask on the insulator layer; and
    depositing the gate in the recess according to the gate mask.

20. The method of claim 16:

wherein forming the recess is preceded by forming an insulator layer on the channel layer;

wherein etching the recess according to the first and second portions of the photoresist comprises:

etching the insulator layer using a selective etchant such that only portions of the insulator layer not covered by the first and second portions of the photoresist are removed; and etching portions of the channel layer not covered by the first and second portions of the photoresist using the second portion of the photoresist and the insulator layer as a mask; and wherein etching the recess according to the first portion of the photoresist comprises:

etching the insulator layer on the drain side of the gate region using inductively coupled plasma (ICP) and/or reactive ion etching (RIE); and etching the channel layer on the source side and the drain side of the gate region.

21. The method of claim 15, wherein forming the channel layer comprises forming the channel layer the first thickness is from about 300 Å to about 800 Å and wherein the second thickness T2 is from about 500 Å to about 1500 Å.

22. The method of claim 15, wherein the gate has a first sidewall and a second sidewall, the first sidewall being on a source side of the gate and the second sidewall being on a drain side of the gate and wherein the channel layer having the first thickness extends from about 0.15 to about 0.3 μm from the first sidewall of the gate towards the drain.

23. The method of claim 15, wherein the gate has a first sidewall and a second sidewall, the first sidewall being on a source side of the gate and the second sidewall being on a drain side of the gate and wherein the channel layer having the second thickness extends from about 0.2 to about 0.5 μm from the second sidewall of the gate towards the source.

* * * * *

UNITED STATES PATENT AND TRADEMARK OFFICE
CERTIFICATE OF CORRECTION

PATENT NO. : 7,402,844 B2
APPLICATION NO. : 11/289158
DATED : July 22, 2008
INVENTOR(S) : Sriram It is certified that error appears in the above-identified patent and that said Letters Patent is hereby corrected as shown below:

On Title Page:

Item 30, Foreign Patent Documents:
Page 2, Please correct "WO2005114749 * 12/2005"
       To read -- WO2005114746   12/2005 --

Other Publications:
Page 2, Column 2: Please correct "PCT/uS2006004139" in the following:
      To read -- International Search Report and Written Opinion of the
      International Searching Authority, corresponding to PCT/uS2006044139,
      mailed Mar. 26 2007. --

In the Claims:

Column 11, Claim 7, Line 39: Please correct "a earner"
                                         To read -- a carrier --

Signed and Sealed this

Twenty-first Day of October, 2008

JON W. DUDAS
*Director of the United States Patent and Trademark Office*